United States Patent
Lee et al.

(10) Patent No.: US 9,722,197 B2
(45) Date of Patent: Aug. 1, 2017

(54) INVERTED ORGANIC ELECTRONIC DEVICE AND METHOD FOR MANUFACTURING THE SAME

(71) Applicant: GWANGJU INSTITUTE OF SCIENCE AND TECHNOLOGY, Gwangju (KR)

(72) Inventors: Kwanghee Lee, Gwangju (KR); Hongkyu Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 52 days.

(21) Appl. No.: 14/568,722

(22) Filed: Dec. 12, 2014

(65) Prior Publication Data

US 2015/0179965 A1 Jun. 25, 2015

(30) Foreign Application Priority Data

Dec. 24, 2013 (KR) ........................ 10-2013-0162744

(51) Int. Cl.
*H01L 51/44* (2006.01)
*H01L 51/46* (2006.01)
(Continued)

(52) U.S. Cl.
CPC .......... *H01L 51/441* (2013.01); *H01L 27/302* (2013.01); *H01L 51/4253* (2013.01);
(Continued)

(58) Field of Classification Search
CPC ........ H01G 9/0029; H01G 9/004; H01G 9/20; H01G 9/2022; H01G 9/2027;
(Continued)

(56) References Cited

FOREIGN PATENT DOCUMENTS

KR 1020130037569 A 4/2013
WO WO 2012154557 A2 * 11/2012 ........... H01L 27/302

OTHER PUBLICATIONS

(Supportive Materials for Exception on Feb. 3, 2013) Dongwon Kim, Self-vertical Phase Separation of Nonconjugated Polyelectrolyte in Photoactive Layer for Inverted Polymer Solar Cells, 2013, 50 pages, Thesis for Master's Degree, Department of Nanobio Materials and Electronics, Gwangju Institute of Science and Technology.
(Continued)

*Primary Examiner* — Christina Chern
(74) *Attorney, Agent, or Firm* — Hauptman Ham, LLP (57) ABSTRACT

Disclosed is a method for manufacturing an inverted organic electronic device. The method includes preparing a substrate having a first electrode; depositing a mixture of a cathode interface material and a photo active material onto the first electrode to form a bilayer or composite layer of a cathode interface layer and a photo active layer, followed by forming an anode interface layer on the bilayer or composite layer; and forming a second electrode on the anode interface layer. According to the present invention, it is possible to achieve simplification of a manufacturing process of an inverted organic electronic device and to provide an inverted organic electronic device having excellent performance by forming a cathode interface layer in the form of a uniform and pinhole-free thin film.

12 Claims, 9 Drawing Sheets

(51) Int. Cl.
*H01L 51/42* (2006.01)
*H01L 27/30* (2006.01)
*H01L 51/00* (2006.01)

(52) U.S. Cl.
CPC ...... *H01L 51/0036* (2013.01); *H01L 51/0047* (2013.01); *Y02E 10/549* (2013.01); *Y02P 70/521* (2015.11)

(58) Field of Classification Search
CPC ... H01G 9/2072; H01L 51/00; H01L 51/0001; H01L 51/0002; H01L 51/0003; H01L 51/0005; H01L 51/0006; H01L 51/0032; H01L 51/0037; H01L 51/0045
See application file for complete search history.

(56) References Cited

OTHER PUBLICATIONS (Supportive Materials for Exception on Sep. 23, 2013) Hongkyu Kang et al., Self-assembly of interfacial and photoactive layers via one-step solution processing for efficient inverted organic solar cells, 2013, pp. 11587-11591, vol. 5, Nanoscale.

\* cited by examiner

Prior Art

Present Invention

INVERTED ORGANIC ELECTRONIC DEVICE AND METHOD FOR MANUFACTURING THE SAME

CROSS-REFERENCE TO RELATED APPLICATION

This application claims priority to Korean Patent Application No. 10-2013-0162744 filed on 24 Dec. 2013, and all the benefits accruing therefrom under 35 U.S.C. §119, the contents of which is incorporated by reference in its entirety.

BACKGROUND

1. Technical Field

The present invention relates to an inverted organic electronic device and a method for manufacturing the same. More particularly, the present invention relates to a method for manufacturing an inverted organic electronic device, which includes a process of forming a bilayer or composite layer of a cathode interface layer and a photo active layer through coating a cathode interface material and a photo active material onto a substrate only once, and an inverted organic electronic device manufactured thereby.

2. Description of the Related Art

An organic solar cell is a representative organic electronic device and spotlighted in the art as a next generation energy source with various advantages, such as low cost, flexibility, light weight, portability, easy attachment to a curved surface of a building, and the like. In addition, the organic electronic device attracts much attraction by permitting mass production through a printing process that requires lower cost and allows more rapid production rate than vacuum deposition.

The organic solar cell generally has a structure of "substrate/first electrode/interface layer/photo active layer/interface layer/second electrode", in which the interface layers are used to maximize efficiency of the organic solar cell. The most well-known organic solar cell (conventional structure) has a structure of substrate/first electrode/anode interface layer/photo active layer/cathode interface layer/second electrode. On the contrary, as disclosed in Korean Patent Publication No. 2013-0037569A, a solar cell including a first electrode formed on a substrate and an electron transport layer formed on the first electrode is called an inverted organic solar cell, and has a structure of substrate/first electrode/cathode interface layer/photo active layer/anode interface layer/second electrode. Such an inverted organic solar cell has higher stability and allows easier printing than an existing organic solar cell structure and thus attracts attention particularly as a commercially available structure.

In the inverted organic solar cell, the cathode interface layer provides a very important function. Generally, as the first electrode on the substrate, for example, as a cathode, a transparent electrode is used in the art. However, most transparent electrodes (for example, indium tin oxide (ITO)) have high work function and thus are not suitable for collection of electrons generated in the photo active layer. Here, when the cathode interface layer is formed on the cathode, it is possible to achieve significant reduction in work function of the cathode while facilitating collection of electrons. Such a cathode interface layer may be composed of metal oxides, conjugated polyelectrolytes, metal carbonates, self-assembly monolayers, non-conjugated polymers, and the like.

However, since such a cathode interface layer has a film thickness of a few nanometers to dozens of nanometers in an optimized inverted solar cell, it is very difficult to form the cathode interface layer in the form of a uniform and pinhole-free thin film and there is a need for an additional process that is accurate and expensive.

BRIEF SUMMARY

It is one aspect of the present invention to provide an inverted organic electronic device having excellent device performance.

It is another aspect of the present invention to provide a method for manufacturing an inverted organic electronic device, which allows easy and spontaneous formation of a cathode interface layer in the form of a uniform and pinhole-free thin film, thereby simplifying a manufacturing process.

It should be understood that the present invention is not limited thereto and other aspects will become apparent to those skilled in the art from the following description.

In accordance with one aspect of the present invention, there is provided an inverted organic electronic device that includes: a first electrode formed on a substrate; a bilayer or composite layer of a cathode interface layer and a photo active layer formed on the first electrode; an anode interface layer formed on the bilayer or composite layer of the cathode interface layer and the photo active layer; and a second electrode formed on the anode interface layer.

In accordance with another aspect of the present invention, there is provided a method for manufacturing an inverted organic electronic device, which includes: preparing a substrate having a first electrode; depositing a mixture of a cathode interface material and a photo active material onto the first electrode to form a bilayer or composite layer of a cathode interface layer and a photo active layer, followed by forming an anode interface layer on the bilayer or composite layer; and forming a second electrode on the anode interface layer.

According to the present invention, it is possible to achieve simplification of a process of manufacturing an inverted organic electronic device and to provide an inverted organic electronic device having excellent performance by forming a cathode interface layer in the form of a uniform and pinhole-free thin film.

BRIEF DESCRIPTION OF THE DRAWINGS

The above and other aspects, features, and advantages of the present invention will become apparent from the detailed description of the following embodiments in conjunction with the accompanying drawings.

DETAILED DESCRIPTION

Hereinafter, an inverted organic electronic device and a method for manufacturing the same according to exemplary embodiments of the present invention will be described in detail with reference to the accompanying drawings such that the present invention can be easily realized by a person having ordinary knowledge in the art.

It will be understood that, although the terms "first", "second", and the like may be used herein to describe various elements, components and/or layers, these elements, components and/or layers should not be limited by these terms. These terms are only used to distinguish one element, component, or layer from another element, component, or layer.

The present invention may be applied to manufacture of devices, such as organic light emitting diodes (OLEDs), organic field effect transistors (OFETs), and organic solar cells, which are generally based on organic photovoltaic techniques. Herein, for convenience of description, the present invention will be described with reference to an organic solar cell.

In addition, a first electrode and a second electrode as used herein may mean a cathode and an anode or vice versa, respectively. In the following description, the first electrode refers to the cathode and the second electrode refers to the anode.

Here, the anode serves to collect holes and the cathode serves to collect electrons.

A conventional organic solar cell structure is composed of a substrate/first electrode/anode interface layer/photo active layer/cathode interface layer/second electrode, in which a transparent electrode formed of indium tin oxide (ITO) and having high work function is used as the first electrode, and Al or Ca or other low work-function materials are used as a material for the second electrode. The photo active layer may have a bilayer structure of an electron donor and an electron acceptor, or a bulk hetero-junction (BHJ) structure formed by mixing an electron donor material and an electron acceptor material. In order to generate photocurrent in the solar cell, excitons (electron-hole pairs) generated in the photo active layer by absorption of light must be separated into electrons and holes at a bonding interface between the electron donor material and the electron acceptor material. Here, since the exciton has a diffusion length of about 10 nm, the BHJ structure having a wide bonding interface in the photo active layer is advantageous in separation of excitons into electrons and holes.

On the other hand, the anode interface layer interposed between the first electrode and the photo active layer and the cathode interface layer interposed between the second electrode and the photo active layer act as buffer layers capable of enhancing efficiency of transfer and collection of holes and electrons separated from the excitons.

However, in the conventional solar cell, PEDOT:PSS (poly(3,4-ethylenedioxythiophene):poly(styrene sulfonate) typically used as a material for the anode interface layer exhibits strong acidity, thereby causing corrosion of a lower electrode, that is, the first electrode. In addition, a low work function material, such as Al and the like, generally used as an upper electrode, that is, the second electrode, form an oxide layer at an interface between the upper electrode and air, thereby providing a negative influence on lifetime and efficiency of the solar cell.

As an effort for solving such problems in the art, an inverted organic solar cell having a structure of substrate/first electrode/cathode interface layer/photo active layer/anode interface layer/second electrode has been suggested.

However, in such an inverted organic solar cell, when a cathode interface layer composed of a metal oxide, a conjugated polyelectrolyte, a metal carbonate, a self-assembled monolayer, a non-conjugated polymer, and the like, and a photo active layer are sequentially stacked on the first electrode, there are problems in that the interface layer can be non-uniformly formed and can suffer from generation of defects. To solve such problems, the present invention provides a method of forming the cathode interface layer and the photo active layer through a single process instead of separate processes.

To this end, the present invention provides a method for manufacturing an inverted organic electronic device, which includes: preparing a substrate having a first electrode; depositing a mixture of a cathode interface material and a photo active material onto the first electrode to form a bilayer or composite layer of a cathode interface layer and a photo active layer, followed by forming an anode interface layer on the bilayer or composite layer; and forming a second electrode on the anode interface layer.

The inverted organic electronic device manufactured thereby may include: a first electrode formed on a substrate; a bilayer or composite layer of a cathode interface layer and a photo active layer formed on the first electrode; an anode interface layer formed on the bilayer or composite layer of the cathode interface layer and the photo active layer; and a second electrode formed on the anode interface layer.

First, the substrate having the first electrode is prepared. The substrate may be flexible substrate. And the substrate may include one material selected from the group consisting of PET, PEN, PI, Si, $SiO_2$, Ge, GaN, AlN, GaP, InP, GaAs, SiC, $Al_2O_3$, $LiAlO_3$, MgO, glass, quartz, sapphire, graphite, graphene, and combinations thereof, without being limited thereto.

According to the present invention, examples of materials for the first electrode may include metals, such as vanadium, chromium, copper, zinc and gold, or alloys thereof; metal oxides such as zinc oxides, indium oxides, indium tin oxide (ITO), titanium oxide (TiO), and indium zinc oxide (IZO); combinations of metals and oxides such as ZnO:Al or $SnO_2$:Sb; and conductive polymers such as poly(3-methylthiophene), poly[3,4-(ethylene-1,2-dioxy)thiophene] (PEDT), polypyrrole and polyaniline, without being limited thereto.

The mixture of the cathode interface material and the photo active material is deposited onto the first electrode to form the bilayer or composite layer of the cathode interface layer and the photo active layer, followed by forming the anode interface layer on the bilayer or composite layer.

In this embodiment, a principle of spontaneous formation of the bilayer of the cathode interface layer/photo active layer through deposition of the mixture onto the first electrode is used. The formation of the bilayer from the mixture is mainly caused by vertical phase separation due to a difference in surface energy between materials. That is, a material having a relatively high surface energy forms a thin film on the electrode and a material having a relatively low surface energy forms a thin film on the material having a relatively high surface energy. Here, the degree of separation between the cathode interface layer and the photo active layer can vary depending upon combinations of the materials and surface energy thereof. Thus, the present invention may include not only the case where the cathode interface layer and the photo active layer are completely separated from each other in the vertical direction to form the bilayer, but also the case where the cathode interface layer and the photo active layer are not completely separated from each other and form a composite layer of the cathode interface material and the photo active material at an interface therebetween. Accordingly, it can be conceptually understood that the resulting material formed by depositing the mixture of the cathode interface material and the photo active material onto the first electrode includes the composite layer of the cathode interface layer and the photo active layer.

Accordingly, in the present invention, the material having a relatively high surface energy is used as the cathode interface material and the material having a relatively low surface energy is used as the photo active material such that the cathode interface layer can be formed on the first electrode and most of the photo active layer can be formed on the cathode interface layer. Although a larger difference in surface energy between the cathode interface material and the photo active material is more preferable, the present invention is not limited thereto. For example, a cathode interface material such as PEI is a hydrophilic material soluble in water and generally has high surface energy, and a photo active material soluble in chlorobenzene and dichlorobenzene is a hydrophobic material and generally has low surface energy. Thus, the difference in surface energy of these materials may be used.

To this end, in the present invention, an "amine group-containing non-conjugated polymer" may be used as the cathode interface material. For example, the cathode interface material may include at least one of polyethyleneimine (PEI), polyallylamine (PAA) and polylysine (PLS), without being limited thereto. As a representative example of the "amine group-containing non-conjugated polymer", PEI contains an amine group, which is hydrophilic and imparts "high surface energy" to PEI, thereby spontaneously forming a bilayer together with the photo active material having low surface energy through vertical phase separation while significantly lowering work function of the electrode by generating strong surface dipoles on the surface of the electrode.

The photo active material may include an electron acceptor formed of an n-type semiconductor material and an electron donor formed of a p-type semiconductor material, and may have a bulk hetero-junction (BHJ) structure.

The bulk hetero-junction (BHJ) structure allows electron-hole pairs excited by light absorbed in the photo active layer to be separated into electrons and holes by a difference in electron affinity between the electron acceptor and the electron donor when the electron-hole pairs diffuse and arrive at an interface between the electron acceptor and the electron donor, in which the electrons are shifted to the cathode through the electron acceptor and the holes are shifted to the anode through the electron donor, thereby generating photocurrent.

Specifically, the photo active material may include at least two selected from the group consisting of polyaniline, polypyrrole, polythiophene, poly(p-phenylene vinylene), P3HT (poly(3-hexylthiophene)), $IC_{60}BA$ (indene-C60 bisadduct), MEH-PPV (poly[2-methoxy-5-(2'-ethyl-hexyloxy)-1,4-phenylene vinylene), MDMO-PPV (poly(2-methoxy-5-(3,7-dimethyloctyloxy)-1,4-phenylene-vinylene), pentacene, poly(3,4-ethylenedioxythiophene) (PEDOT), poly(3-alkylthiophene), poly((4,8-bis(octyloxy) benzo(1,2-b:4,5-b')dithiophene-2,6-diyl)(2-((dodecyloxy) carbonyl)thieno(3,4-b)thiophenediyl) (PTB1), poly((4,8-bis (2-ethylhexyloxy)benzo(1,2-b:4,5-b')dithiophene-2,6-diyl) (2-((2-ethylhexyloxy)carbonyl)-3-fluorothieno(3,4-b) thiophenediyl) (PTB7), phthalocyanine, tin (II) phthalocyanine (SnPc), copper phthalocyanine, triarylamine, benzidine, pyrazoline, styrylamine, hydrazone, carbazole, thiophene, 3,4-ethylenedioxythiophene (EDOT), pyrrole, phenanthrene, tetracene, naphthalene, rubrene, 1,4,5,8-naphthalene-tetracarboxylic dianhydride (NTCDA), Alq3, fullerene (C60, C70, C74, C76, C78, C82, C84, C720, C860, etc.), (1-(3-methoxycarbonyl)propyl-1-phenyl(6,6)C61 (PCBM), C71-PCBM, C84-PCBM, bis-PCBM, perylene, CdS, CdTe, CdSe, ZnO, derivatives thereof, and combinations thereof, without being limited thereto.

When materials having different energy levels are used in formation of the bulk hetero-junction structure, a material, the energy level of which is relatively apart from a vacuum level to have a relatively low lowest unoccupied molecular orbital (LUMO) level, may be used as the n-type semiconductor material and a material, the energy level of which is relatively close to the vacuum level to have a relatively high LUMO level, may be used as the p-type semiconductor material.

Next, a process of preparing the mixture of the cathode interface material and the photo active material will be described.

The mixture of the cathode interface material and the photo active material may be prepared by mixing a first solution, which is prepared by dissolving the cathode interface material in a first solvent such as water or alcohols including methanol, ethanol, isopropanol, 2-methoxyethanol, butanol, and the like, with a second solution, which is prepared by dissolving the photo active material in a second solution such as chlorobenzene, and the like.

The amount of the first solvent used in the preparation of the first solution and the amount of the second solution used in the preparation of the second solution may be adjusted in various way depending upon the kinds of materials and solvents, and the mixing ratio of the first solution to the second solution may also be suitably adjusted, as needed. Here, preferably the second solution is a main solution and the first solution is present in a relatively small amount in the mixed solution.

Each of the first and second solvents may include water, an organic solvent, and a combination thereof.

Specifically, each of the first and second solvents may be selected from the group consisting of deionized water, methanol, ethanol, propanol, 1-butanol, isopropanol, 2-methoxyethanol, 2-ethoxyethanol, 2-propoxyethanol, 2-buthoxyethanol, methylcellosolve, ethylcellosolve, diethylene glycol methylether, diethylene glycol ethylether, dipropylene glycol methylether, toluene, xylene, hexane, heptane, octane, ethyl acetate, butyl acetate, diethylene glycol dimethylether, diethylene glycol dimethylethyether, methyl methoxypropionate, ethyl ethoxypropionate, ethyl lactate, propylene glycol methyl ether acetate, propylene glycol methyl ether, propylene glycol propyl ether, methylcellosolve acetate, ethylcellosolve acetate, diethylene glycol methyl acetate, diethylene glycol ethyl acetate, acetone, chloroform, methyl isobutyl ketone, cyclohexanone, dimethylformamide (DMF), N,N-dimethylacetamide (DMAc), N-methyl-2-pyrrolidone, ɣ-butyrolactone, diethylether, ethylene glycol dimethyl ether, diglyme, tetrahydrofuran, chlorobenzene, dichlorobenzene, acetylacetone, acetonitrile, bromobenzene, 1-chloronaphthalene, fluorobenzene, 1,2,4-trichlorobenzene, 2-bromothiophene, benzaldehyde, acetophenone, ethylene dichloride, 1,1,2,2-tetrachloroethane, iodobenzene, 1-bromonaphtalene, nitrobenzene, pyridine, di-(2-chloroethyl) ether, benzyl acetate, cyclohexylchloride, tetrahydronaphthalene, 1-iodonaphthalene, cyclohexanone, 1,1,2-trichloroethane, trichloroethylene, 2-chlorothiophene, 1,1,1-trichloroethane, styrene, diethyl sulfide, methylene diiodide, 1,1,2,2-tetrabromoethane, 1-chlorobutane, ethyl benzene, butanethiol, benzene, thiophene, methylene dichloride, 1,4-dioxane, cyclohexylamine, furan, carbon tetrachloride (0 dipole moment), tetrahydrofuran, N-methyl pyrrolidine, methylethylketone, methylisobutylketone), cyclohexane, 2-nitropropane, and combinations thereof, without being limited thereto.

Then, when the prepared mixture of the cathode interface material and the photo active material is deposited onto the first electrode, the bilayer or composite layer of the cathode interface layer and the photo active layer can be spontaneously formed due to the difference in surface energy between the materials.

Figure 1:
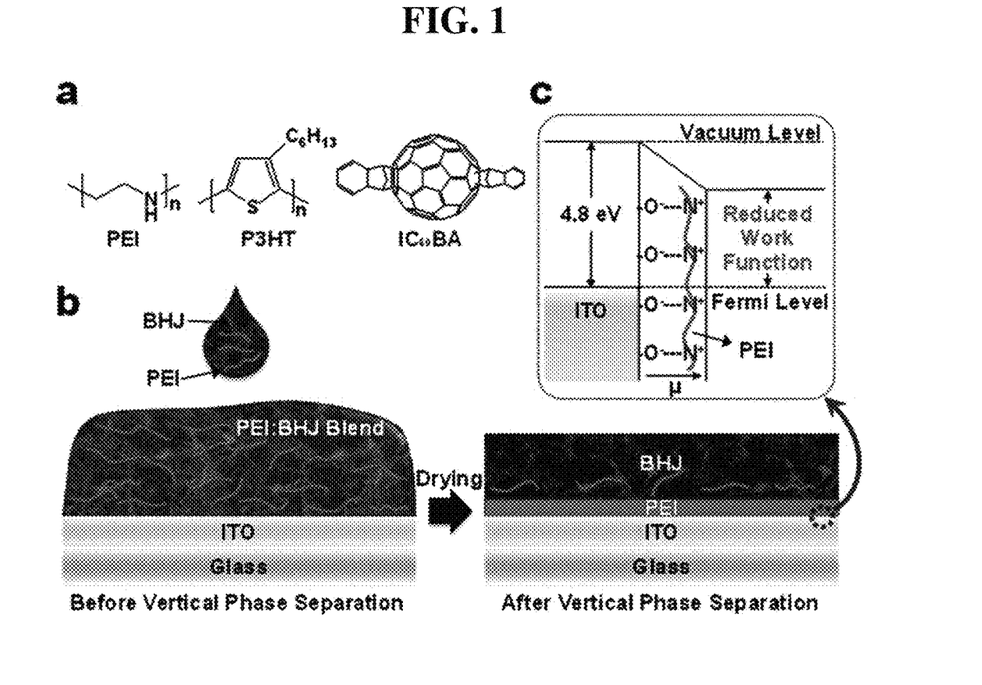
FIG. 1 is a diagram illustrating vertical phase separation of a cathode interface layer and a photo active layer in accordance with one embodiment of the present invention.

In one embodiment, PEI is used as the cathode interface material and P3HT:IC$_{60}$BA (BHJ) is used as the photo active material to form a mixture of PEI and BHJ, which in turn is deposited onto an ITO electrode. Then, a PEI layer is formed on the ITO electrode and the BHJ layer is formed on the PEI layer, as shown in FIG. 1.

Figure 2:
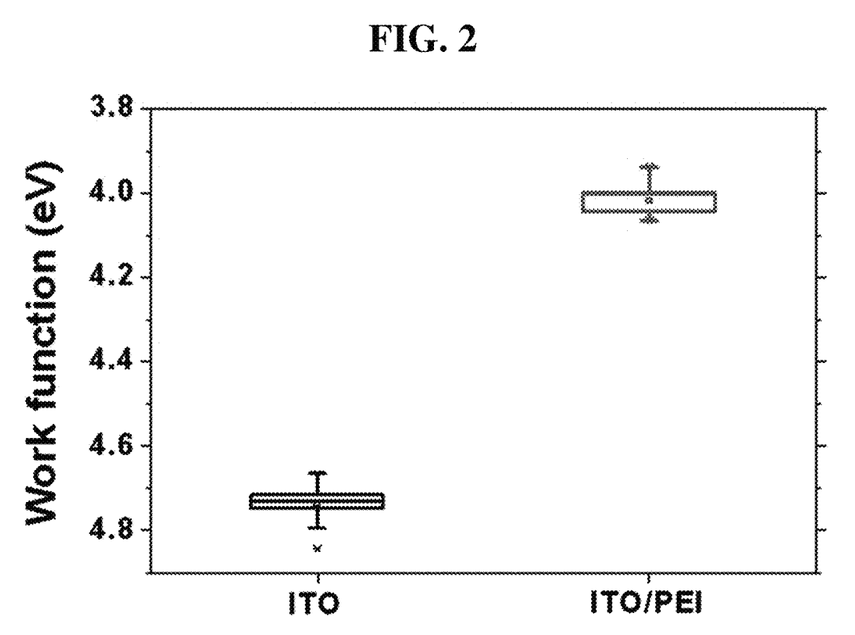
FIG. 2 is a graph depicting variation of work function of a cathode before and after formation of a cathode interface layer.

Particularly, PEI generates strong dipoles on the surface of the ITO electrode, thereby significantly reducing work function of the electrode (see FIG. 2).

In addition, the process of depositing the mixture of the cathode interface material and the photo active material onto the first electrode may be realized by a solvent process, for example, spin coating, roll coating, spray coating, flow coating, ink-jet printing, nozzle printing, dip coating, tape casting, screen printing, pad printing, doctor-blade coating, gravure printing, thermal transfer, gravure offset-printing, and the like.

Then, the anode interface layer is formed on the bilayer or composite layer of the cathode interface layer and the photo active layer. More specifically, since the cathode interface layer having a relatively high surface energy is formed on the first electrode and the photo active layer having a relatively low surface energy is formed on the cathode interface layer in the bilayer or composite layer, it can be considered that the anode interface layer is formed on the photo active layer.

An anode interface material for the anode interface layer may include at least one selected from the group consisting of poly(3,4-ethylenedioxythiophene):poly(styrenesulfonate) (PEDOT:PSS), bi-phenyl-tri-thiophene (BP3T), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), molybdenum oxide, vanadium oxide, and combinations thereof, without being limited thereto.

The anode interface layer may be deposited by a solution process using certain media.

By way of example, liquid media essentially consist of at least one organic solvent. The liquid media essentially consist of water, or water and an organic solvent. The organic solvent may be an aromatic solvent. For example, the organic solvent may be selected from chloroform, dichloromethane, toluene, anisole, or mixtures thereof.

The anode interface layer may be formed by the same process as the process of depositing the mixture of the cathode interface material and the photo active material, as described above.

Alternatively, the anode interface layer may be formed not only by the aforementioned solution process, but also by sputtering, e-beam evaporation, thermal deposition, and chemical vapor deposition, without being limited thereto.

After the formation of the anode interface layer and before the formation of the second electrode on the anode interface layer, a process of forming an additional bilayer or composite layer of a cathode interface layer and a photo active layer and forming an additional anode interface layer on the additional bilayer or composite layer of the cathode interface layer and the photo active layer may be further performed at least once.

As a result, the inverted organic electronic device may further include at least one additional bilayer or composite layer of the cathode interface layer and the photo active layer between the anode interface layer and the second electrode; and at least one additional anode interface layer formed on the additional bilayer or composite layer of the cathode interface layer and the photo active layer.

A material for forming the additional bilayer or composite layer of the cathode interface layer and the photo active layer may be the same as or different from the material for forming the other bilayer or composite layer of the cathode interface layer and the photo active layer. In addition, a material for forming the additional anode interface layer formed on the additional bilayer or composite layer of the cathode interface layer and the photo active layer may be the same as or different from the material for forming the other anode interface layer.

That is, a tandem type (or multilayer type) organic solar cell having at least two photo active layers may be produced to provide further enhanced effects. As compared with a monolayer type organic solar cell (that is, a solar cell including a single photo active layer) using a narrow absorption band of sunlight, the tandem type organic solar cell includes two or more photo active layers, thereby enabling use of a wider absorption band of sunlight. Therefore, the tandem type solar cell can provide further enhanced efficiency than the monolayer type solar cell.

In addition, efficiency of the organic electronic device can be optimized by changing a combination of the cathode interface material, the photo active material and the anode interface material that constitute the respective layers.

Then, the second electrode may be formed on the anode interface layer.

The second electrode may be formed of any material having high work function, without being limited thereto. Examples of the material for the second electrode include metals such as magnesium, calcium, sodium, potassium, copper, titanium, indium, yttrium, lithium, gadolinium, aluminum, gold, silver, platinum, tin and lead, or alloys thereof; and multilayer-structure materials including Li or Al such as LiAl and LiF/Al or LiO$_2$/Al, without being limited thereto. The second electrode may be composed of a single layer or multiple layers. In this way, the cathode interface layer and the photo active layer are formed by a single process, thereby simplifying the process of manufacturing the inverted organic electronic device while securing equivalent or superior device characteristics to an organic electronic device in which the cathode interface layer and the photo active layer are formed by separate processes.

Next, the present invention will be described in more detail with reference to some examples. However, it should be understood that these examples are given by way of illustration only and are not to be construed in any way as limiting the present invention. For reference, different kinds of photo active materials are distinguished from each other with numerals after BHJ in the following examples and comparative examples for convenience of description.

EXAMPLES

Comparative Example 1: Manufacture of Inverted Organic Solar Cell

After stacking ITO on a glass substrate, the obtained stack was subjected to cleaning with water/ultrasound and cleaning with acetone and isopropyl alcohol, followed by drying in an oven through the night.

The substrate was placed in a glove box and a P3HT: $IC_{60}BA$ layer was deposited by spin coating. A BHJ1 (P3HT:$IC_{60}BA$) solution was prepared in a concentration of 35 mg/ml (P3HT 17.5 mg+IC60BA 17.5 mg+DCB 1 ml) by dissolving P3HT:$IC_{60}BA$ in a mass ratio of 1:1 in 1,2-dichlorobenzene (DCB). The prepared P3HT:$IC_{60}BA$ solution was spin-coated onto the ITO layer in the glove box, followed by solvent annealing and drying at 80° C. for 10 minutes. Then, poly(3,4-ethylenedioxythiophene):poly(styrene sulfonate) (PEDOT:PSS) was deposited onto the P3HT:$IC_{60}BA$ layer by spin coating, followed by drying at 80° C. for 10 minutes. Finally, an Ag electrode was formed to a thickness of 100 nm on the PEDOT:PSS layer in a vacuum of $1\times10^{-7}$ torr. A completed organic solar cell was subjected to heat treatment at 150° C. for 5 minutes.

The structure of the organic solar cell manufactured as above can be represented by glass/ITO/BHJ1/PEDOT:PSS/Ag.

Comparative Example 2: Manufacture of Inverted Organic Solar Cell

After stacking ITO on a glass substrate, the obtained stack was subjected to cleaning with water/ultrasound and cleaning with acetone and isopropyl alcohol, followed by drying in an oven through the night.

A PEI solution (0.05~0.2 wt % of PEI solution) was prepared by dissolving polyethyleneimine (PEI) in water and isopropyl alcohol and spin-coated onto the ITO layer, followed by drying at 80° C. in air for 10 minutes. Then, the substrate was placed in a glove box and a P3HT:$IC_{60}BA$ layer was formed by spin coating. A BHJ1 (P3HT:$IC_{60}BA$) solution was prepared in a concentration of 35 mg/ml (P3HT 17.5 mg+$IC_{60}BA$ 17.5 mg+DCB 1 ml) by dissolving P3HT:$IC_{60}BA$ in a mass ratio of 1:1 in 1,2-dichlorobenzene (DCB). The prepared P3HT:$IC_{60}BA$ solution was spin-coated onto a PEI layer in the glove box, followed by solvent annealing and drying at 80° C. for 10 minutes. Then, poly(3,4-ethylenedioxythiophene):poly(styrene sulfonate) (PEDOT:PSS) was deposited onto the P3HT:$IC_{60}BA$ layer by spin coating, followed by drying at 80° C. for 10 minutes. Finally, an Ag electrode was formed to a thickness of 100 nm on the PEDOT:PSS layer in a vacuum of $1\times10^{-7}$ torr. A completed organic solar cell was subjected to heat treatment at 150° C. for 5 minutes.

The structure of the organic solar cell manufactured as above can be represented by glass/ITO/PEI/BHJ1/PEDOT:PSS/Ag.

Example 1: Manufacture of Modified Monolayer Type Inverted Organic Solar Cell

After stacking ITO on a glass substrate, the obtained stack was subjected to cleaning with water/ultrasound and cleaning with acetone and isopropyl alcohol, followed by drying in an oven through the night.

A PEI solution (0.05~0.2 wt % of PEI solution) was prepared by dissolving polyethyleneimine (PEI) in water and isopropyl alcohol, and a BHJ1 (P3HT:$IC_{60}BA$) solution was prepared in a concentration of 35 mg/ml (P3HT 17.5 mg+$IC_{60}BA$ 17.5 mg+DCB 1 ml) by dissolving P3HT:$IC_{60}BA$ in a mass ratio of 1:1 in 1,2-dichlorobenzene (DCB). Then, a PEI:BHJ1 mixed solution was prepared by mixing the PEI solution and the BHJ1 solution in a mass ratio of 1:19 (50 mg of PEI solution and 950 mg of BHJ1 solution).

Then, the substrate was placed in a glove box and the PEI:BHJ1 mixed solution was deposited onto the ITO layer by spin coating, followed by solvent annealing and drying at 80° C. for 10 minutes. Then, poly(3,4-ethylenedioxythiophene):poly(styrene sulfonate) (PEDOT:PSS) was deposited onto the PEI:BHJ1 mixed layer by spin coating, followed by drying at 80° C. for 10 minutes. Finally, an Ag electrode was formed to a thickness of 100 nm on the PEDOT:PSS layer in a vacuum of $1\times10^{-7}$ torr. A completed organic solar cell was subjected to heat treatment at 150° C. for 5 minutes.

The structure of the organic solar cell manufactured as above can be represented by glass/ITO/PEI:BHJ1/PEDOT:PSS/Ag.

Example 2: Manufacture of Modified Tandem Type Inverted Organic Solar Cell

A tandem type organic solar cell was manufactured by the same process as in Example 1 except that the process of spin-coating and drying a PEI:BHJ1 mixed solution PEI:BHJ1 and spin-coating and drying poly(3,4-ethylenedioxythiophene):poly(styrene sulfonate) (PEDOT:PSS) on the PEI:BHJ1 mixed layer was repeated twice. A completed organic solar cell was subjected to heat treatment at 150° C. for 5 minutes.

The structure of the organic solar cell manufactured as above can be represented by glass/ITO/PEI:BHJ1/PEDOT:PSS/-PEI:BHJ1/PEDOT:PSS/Ag.

Example 3: Manufacture of Modified Monolayer Type Inverted Organic Solar Cell

A monolayer type organic solar cell was manufactured by the same process as in Example 1 except that P3HT:$PC_{60}BM$ (BHJ2) was used instead of P3HT:$IC_{60}BA$.

The structure of the organic solar cell manufactured as above can be represented by glass/ITO/PEI:BHJ2/PEDOT:PSS/Ag.

Example 4: Manufacture of Modified Tandem Type Inverted Organic Solar Cell

A tandem type organic solar cell was manufactured by the same process as in Example 2 except that P3HT:$PC_{60}BM$ (BHJ2) was used instead of P3HT:$IC_{60}BA$.

The structure of the organic solar cell manufactured as above can be represented by glass/ITO/PEI:BHJ2/PEDOT:PSS/PEI:BHJ2/PEDOT:PSS/Ag.

Example 5: Manufacture of Modified Monolayer Type Inverted Organic Solar Cell After stacking ITO on a glass substrate, the obtained stack was subjected to cleaning with water/ultrasound waves and cleaning with acetone and isopropyl alcohol, followed by drying in an oven through the night.

A PEI solution (0.05~0.2 wt % of PEI solution) was prepared by dissolving polyethyleneimine (PEI) in water and isopropyl alcohol, and a BHJ3 (d-DTS(PTTh$_2$)$_2$: PC$_{70}$BM) solution was prepared in a concentration of 35 mg/ml (d-DTS(PTTh$_2$)$_2$ 17.5 mg+PC$_{70}$BM 17.5 mg+(CB+DIO) 1 ml) by dissolving d-DTS(PTTh$_2$)$_2$:PC$_{70}$BM in a mass ratio of 1:1 in a solvent, which was prepared by mixing chlorobenzene (CB) and 1,8-diioodooctane (DIO) in a volume ratio of 97:3.

Here, d-DTS(PTTh$_2$)$_2$ refers to 7,7'-(4,4-bis(2-ethylhexyl)-4H-silolo[3,2-b:4,5-b']dithiophene-2,6-diyl)bis(4-(5'-hexyl-[2,2'-bithiophen]-5-yl)-[1,2,5]thiadiazolo[3,4-c]-pyridine) that is an electron donor material, and PC$_{70}$BM is an electron acceptor material.

A mixed solution was prepared by mixing the PEI solution and the BHJ3 solution in a mass ratio of 1:19 (50 mg of PEI solution and 950 mg of BHJ3 solution).

Then, the substrate was placed in a glove box and the PEI:BHJ3 mixed solution was deposited onto the ITO layer by spin coating, followed by solvent annealing and drying at 80° C. for 10 minutes. Next, MoO$_3$ was deposited onto the PEI:BHJ3 mixed layer by thermal deposition. Finally, an Ag electrode was formed to a thickness of 100 nm on the MoO$_3$ layer in a vacuum of $1\times10^{-7}$ torr. A completed organic solar cell was subjected to heat treatment at 130° C. for 10 seconds.

The structure of the organic solar cell manufactured as above can be represented by glass/ITO/PEI:BHJ3/MoO$_3$/Ag.

Example 6: Manufacture of Modified Tandem Type Inverted Organic Solar Cell

After stacking ITO on a glass substrate, the obtained stack was subjected to cleaning with water/ultrasound and cleaning with acetone and isopropyl alcohol, followed by drying in an oven through the night.

A PEI solution (0.05~0.2 wt % of PEI solution) was prepared by dissolving polyethyleneimine (PEI) in water and isopropyl alcohol, and a BHJ1 (P3HT:IC60BA) solution was prepared in a concentration of 35 mg/ml (P3HT 17.5 mg+IC$_{60}$BA 17.5 mg+DCB 1 ml) by dissolving P3HT:IC$_{60}$BA in a mass ratio of 1:1 in 1,2-dichlorobenzene (DCB). Then, a PEI:BHJ1 mixed solution was prepared by mixing the PEI solution and the BHJ1 solution in a mass ratio of 1:19.

Then, the substrate was placed in a glove box and the PEI:BHJ1 mixed solution was deposited onto the ITO layer by spin coating, followed by solvent annealing and drying at 80° C. for 10 minutes. Then, poly(3,4-ethylenedioxythiophene):poly(styrene sulfonate) (PEDOT:PSS) was deposited onto the PEI:BHJ1 mixed layer by spin coating, followed by drying at 80° C. for 10 minutes.

Next, a PEI solution (0.05~0.2 wt % of PEI solution) was prepared by dissolving polyethyleneimine (PEI) in water and isopropyl alcohol, and a BHJ3 (d-DTS(PTTh$_2$)$_2$: PC$_{70}$BM) solution was prepared in a concentration of 35 mg/ml (d-DTS(PTTh$_2$)$_2$ 17.5 mg+PC$_{70}$BM 17.5 mg+(CB+DIO) 1 ml) by dissolving d-DTS(PTTh$_2$)$_2$:PC$_{70}$BM in a mass ratio of 1:1 in a solvent, which was prepared by mixing chlorobenzene (CB) and 1,8-diioodooctane (DIO) in a volume ratio of 97:3. A mixed solution was prepared by mixing the PEI solution with the BHJ3 solution in a mass ratio of 1:19 (50 mg of PEI solution and 950 mg of BHJ3 solution).

Then, the substrate was placed in a glove box and the PEI:BHJ3 mixed solution was deposited onto the PEDOT:PSS layer by spin coating, followed by solvent annealing and drying at 80° C. for 10 minutes. Next, MoO$_3$ was deposited onto the PEI:BHJ3 mixed layer by thermal deposition. Finally, an Ag electrode was formed to a thickness of 100 nm on the MoO$_3$ layer in a vacuum of $1\times10^{-7}$ torr. A completed organic solar cell was subjected to heat treatment at 130° C. for 10 seconds.

The structure of the organic solar cell manufactured as above can be represented by glass/ITO/PEI:BHJ1/PEDOT:PSS/PEI:BHJ3/MoO$_3$/Ag.

Experimental Example 1: Analysis of Water Contact Angle of Material

As described above, it is considered that a difference in surface energy between materials is a main factor causing vertical phase separation of the mixture of the cathode interface material (PEI) and the photo active material (BHJ). To confirm the surface energy of a material, a water contact angle of the material was measured. An analysis sample was prepared by coating each of the materials on a glass substrate/ITO, followed by dropping a water droplet thereon. Then, an angle of the water droplet on the surface of the material was measured and converted into surface energy. (see FIG. 3)

Figure 3:
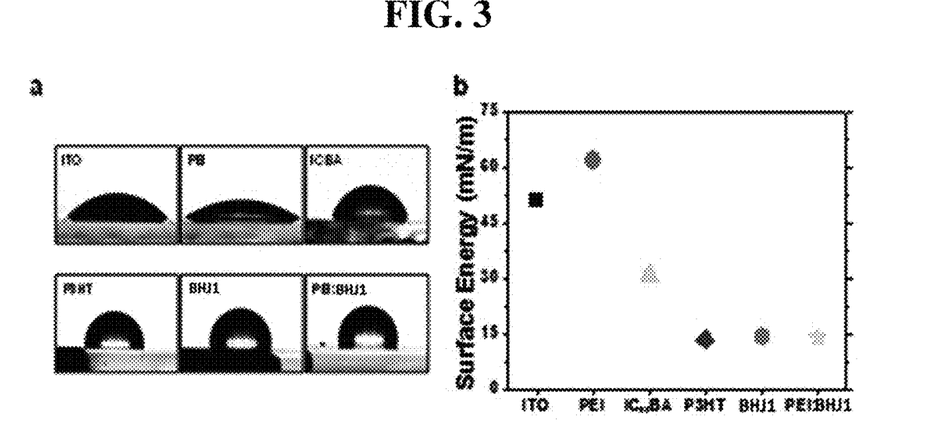
FIG. 3 shows pictures and a graph for analysis of a water contact angle for confirming surface energy of each material used in one example of the present invention.

As a result, the non-coated ITO and the PEI-coated sample had small water contact angles of 47° and 31° corresponding to high surface energies of 50.90 mN/m and 62.06 mN/m, respectively. IC$_{60}$BA and P3HT forming the photo active material had large water contact angles of 72° and 98°, respectively, and the P3HT:IC$_{60}$BA mixed layer (BHJ1) also had a high water contact angle of 96°. In addition, the PEI:P3HT:IC$_{60}$BA mixed layer (PEI:BHJ1) also had a high water contact angle of 97°. Such results mean that IC$_{60}$BA, P3HT, BHJ1, and PEI:BHJ1 had low surface energies of 30.83, 13.33, 14.43 and 13.87 mN/m, respectively.

Consequently, it could be seen that the mixture had a sufficiently large difference in surface energy between PEI and BHJ1 to generate vertical phase separation.

Figure 4:
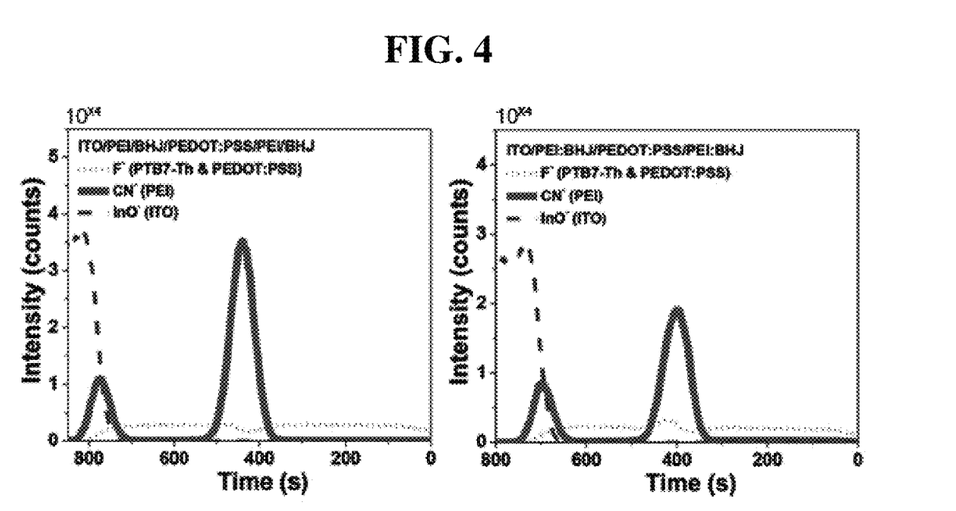
FIG. 4 is graphs depicting results that a cathode interface layer (PEI) is distributed near an ITO electrode in organic solar cells prepared in one example and comparative examples.

Experimental Example 2: Confirmation of Vertical Phase Separation Between PEI and BHJ It was directly confirmed by time-of-flight secondary ion mass spectrometry (TOF-SIMS) that PEI was formed on ITO. TOF-SIMS is a measurement method for confirming vertical distribution of elements in a thin film. Samples of glass/ITO/PEI/BHJ1/PEDOT:PSS/PEI/BHJ and glass/ITO/PEI:BHJ1 PEDOT:PSS/PEI:BHJ were prepared and compared. As a result, it could be seen that the sample of glass/ITO/PEI:BHJ1/PEDOT:PSS/PEI:BHJ prepared using the mixture of PEI:BHJ1 exhibited strong peaks of PEI (CN—) near ITO (InO—) as in the sample of glass/ITO/PEI/BHJ1/PEDOT:PSS/PEI/BHJ in which PEI and BHJ1 layers were separately formed by spin coating. That is, it was proved that a large amount of PEI was distributed near ITO. (see FIG. 4)

Experimental Example 3: Evaluation of Organic Solar Cell Efficiency

Figure 5:
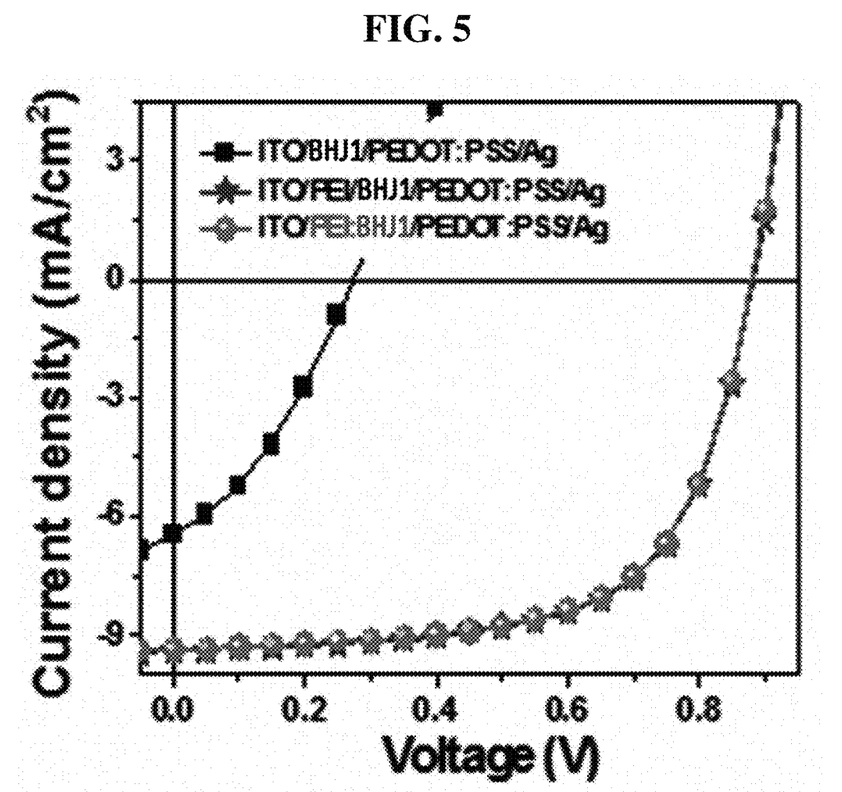
FIG. 5 is a graph depicting performance of organic solar cells prepared in one example and comparative examples.

The samples prepared in Comparative Example 1, Comparative Example 2 and Example 1 were measured as to open circuit voltage (Voc), short-circuit current density (Jsc), fill factor (FF) and power conversion efficiency (PCE). Results are shown in Table 1 and FIG. 5.

TABLE 1

|  | Open circuit voltage (Voc) (V) | Short circuit current density (Jsc) (mA/cm$^2$) | Fill factor (FF) | PCE (%) |
|---|---|---|---|---|
| Example 1 | 0.88 | 9.38 | 0.64 | 5.3 |
| Comparative Example 1 | 0.27 | 6.46 | 0.36 | 0.6 |
| Comparative Example 2 | 0.88 | 9.39 | 0.64 | 5.3 |

As a result, the organic solar cell of Example 1 (glass/ITO/PEI:BHJ1/PEDOT:PSS/Ag) had much better efficiency than the organic solar cell of Comparative Example 1 (glass/ITO/BHJ1/PEDOT:PSS/Ag) which did not include PEI and exhibited the same device performance as that of the organic solar cell of Comparative Example 2 (glass/ITO/PEI/BHJ1/PEDOT:PSS/Ag) in which PEI was separately coated. From this result, it could be concluded that PEI enhanced performance of the organic solar cell by reducing work function of the transparent electrode (ITO).

In addition, in order to confirm that bilayer formation through vertical phase separation of the mixture of PEI and BHJ1 according to the present invention can be applied to printing as well as spin coating, the solar cell (glass/ITO/PEI:BHJ1/PEDOT:PSS/Ag) was manufactured by depositing the PEI:BHJ1 mixture onto the glass substrate/ITO through doctor-blade coating, followed by forming PEDOT:PSS and Ag layers. From measurement results of device performance, it could be seen that the solar cell manufactured by depositing the PEI:BHJ1 mixture on the substrate through doctor-blade coating exhibited similar efficiency (PCE: 5.0%, Voc: 0.83 V, Jsc: 9.32 mA/cm$^2$, FF: 0.65) to the solar cell manufactured by spin coating the mixture.

Figure 6:
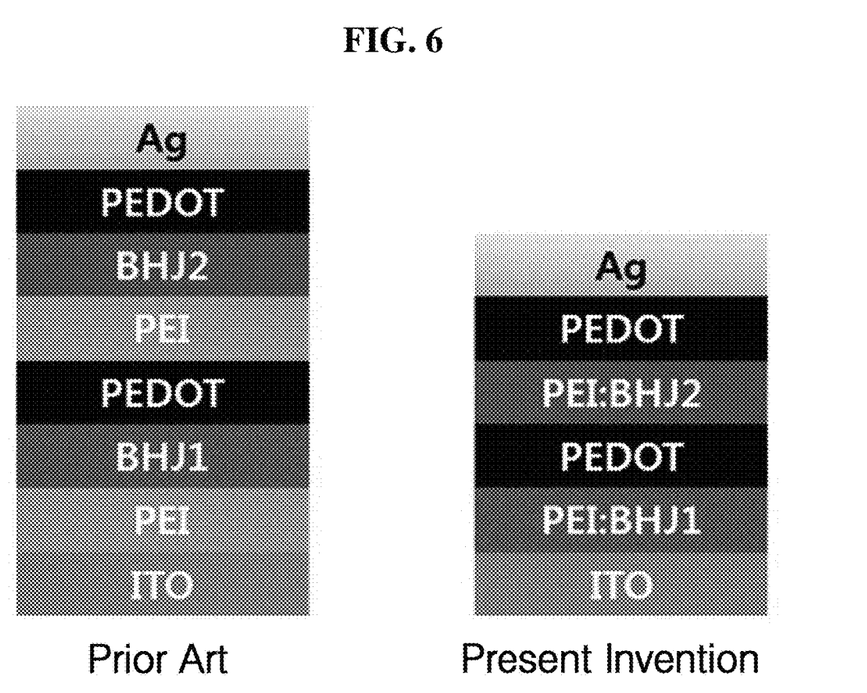
FIG. 6 is configuration views of a tandem type organic solar cell according to one embodiment of the present invention and a tandem type organic solar cell according to prior art.

A tandem type organic solar cell according to prior art (particularly, inverted tandem type organic solar cell) having two photo active layers has a structure of substrate/transparent electrode (ITO)/cathode interface layer (PEI)/photo active layer 1 (BHJ1)/anode interface layer (PEDOT:PSS)/cathode interface layer (PEI)/photo active layer 2 (BHJ2)/anode interface layer (PEDOT:PSS)/electrode (Ag). However, when manufactured by the method according to the present invention, the tandem type organic solar cell has a structure of substrate/transparent electrode (ITO)/cathode interface layer:photo active layer 1 (PEI:BHJ1)/anode interface layer (PEDOT:PSS)/cathode interface layer:photo active layer 2 (PEI:BHJ2)/anode interface layer (PEDOT:PSS)/electrode (Ag), thereby significantly simplifying the manufacturing process by omitting two layers. (see FIG. 6) Here, BHJ1 and BHJ2 may be formed of the same material or different materials. In addition, the cathode interface layer may be formed of other materials instead of PEI.

Figure 7:
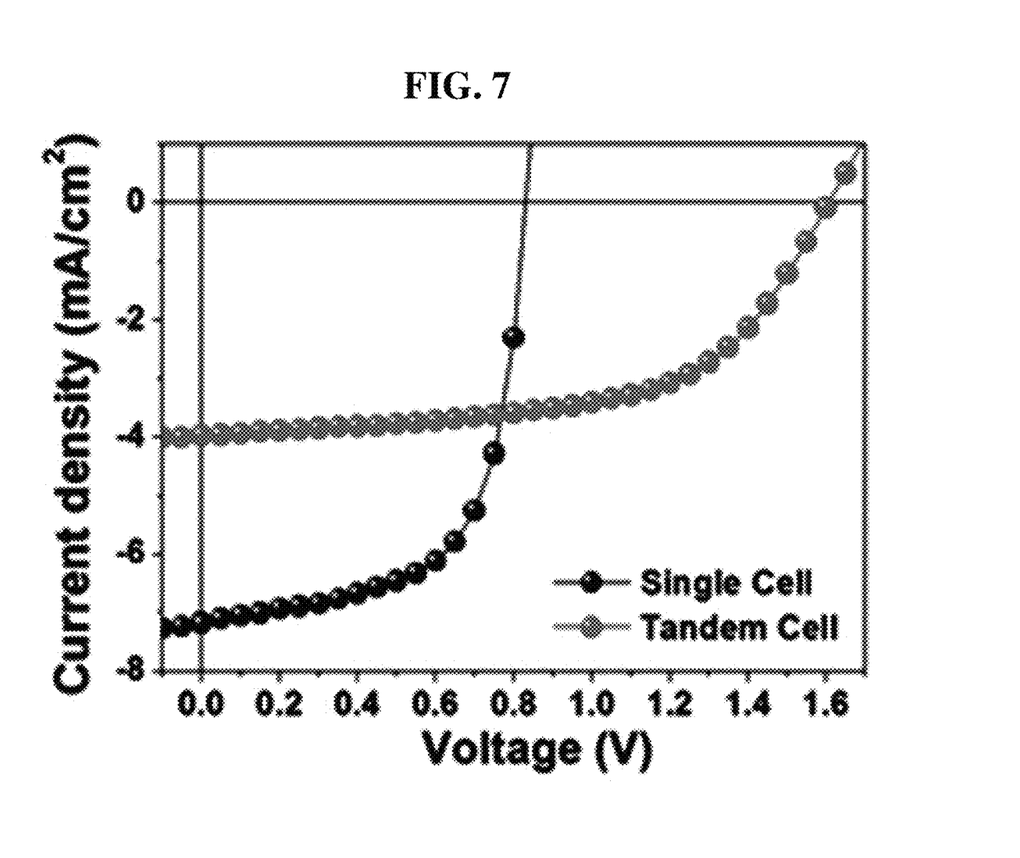
FIG. 7 is a graph depicting performance of a monolayer type organic solar cell and a tandem type organic solar cell according to one embodiment of the present invention.

That the tandem type organic solar cell manufactured by the method according to the present invention is successfully realized can be confirmed from a fact that open circuit voltage (Voc) of the tandem type solar cell is substantially two times that of a monolayer type organic solar cell (that is, the tandem type solar cell provides effects similar to two batteries connected in series. (see Table 2 and FIG. 7)

TABLE 2

|  | Open circuit voltage (Voc) (V) | Short circuit current density (Jsc) (mA/cm$^2$) | Fill factor (FF) | PCE (%) |
|---|---|---|---|---|
| Monolayer type solar cell (Example 3) | 0.83 | 7.18 | 0.63 | 3.76 |
| Tandem type solar cell (Example 4) | 1.61 | 3.98 | 0.58 | 3.7 |

In order to confirm influence on device efficiency in the case of using different photo active materials, additional experiments were performed.

In Example 1, BHJ1 (P3HT:IC$_{60}$BA) was used as the photo active material and in Example 5, BHJ3 (d-DTS (PTTh2)2:PC$_{70}$BM) was used as the photo active material in manufacture of the monolayer type organic solar cell. In Example 6, the tandem type organic solar cell, in which the solar cell structure of Example 1 was used as a front cell and the solar cell structure of Example 5 was used as a back cell, was manufactured.

Figure 8:
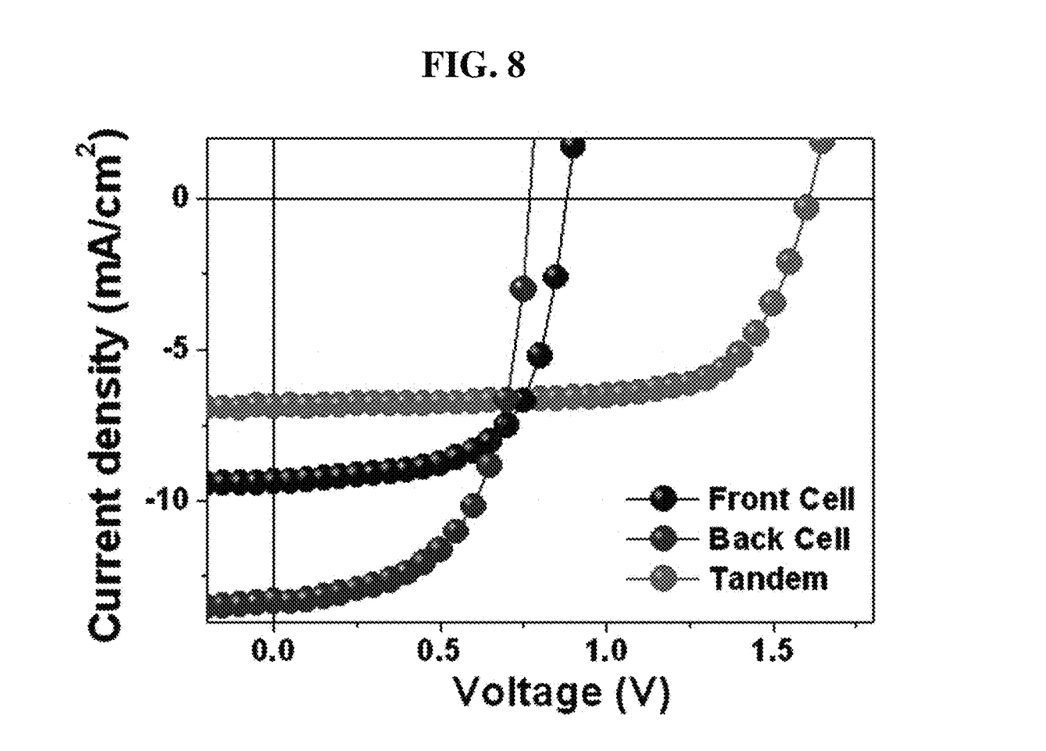
FIG. 8 is a graph depicting performance of a monolayer type organic solar cell and a tandem type organic solar cell according to the embodiment of the present invention.

The organic solar cells prepared in Examples 1, 5 and 6 were measured as to open circuit voltage (Voc), short-circuit current density (Jsc), fill factor (FF) and powerconversion efficiency (PCE). Results are shown in Table 3 and FIG. 8.

TABLE 3

|  | Open circuit voltage (Voc) (V) | Short circuit current density (Jsc) (mA/cm$^2$) | Fill factor (FF) | PCE (%) |
|---|---|---|---|---|
| Monolayer type solar cell (Example 1) | 0.88 | 9.38 | 0.64 | 5.3 |
| Monolayer type solar cell (Example 5) | 0.77 | 13.3 | 0.60 | 6.1 |
| Tandem type solar cell (Example 6) | 1.61 | 6.88 | 0.70 | 7.8 |

With this result, it is anticipated that use of different materials for BHJ1 and BHJ2 will provide further enhanced efficiency through optimization of solar cell manufacture.

Figure 9:
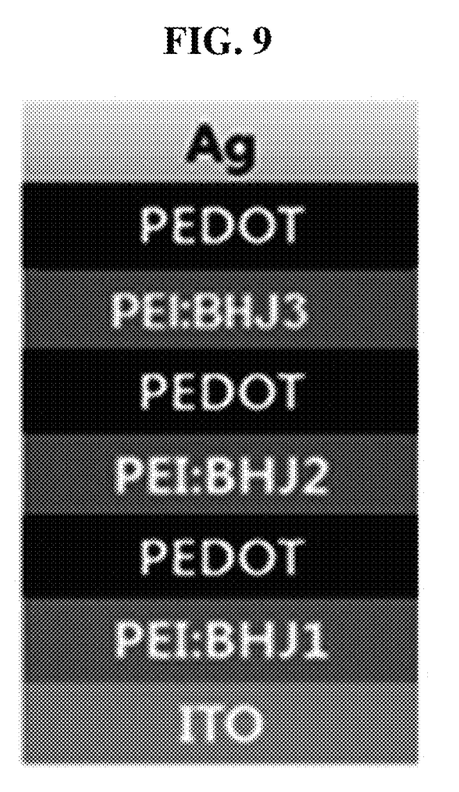
FIG. 9 is a configuration view of a tandem type organic solar cell including three photo active layers according to one embodiment of the present invention.

It is believed that an organic solar cell including three or more photo active layers can be manufactured as well as the tandem type organic solar cell including two photo active layers by a method similar to the method of manufacturing the tandem type organic solar cell. One example of the organic solar cell including three or more photo active layers is shown in FIG. 9.

Although some embodiments have been described above, it should be understood that these embodiments are provided for illustration only and are not to be construed in any way as limiting the present invention, and that various modifications, changes, alterations, and equivalent embodiments can be made by those skilled in the art without departing from the spirit and scope of the invention.

What is claimed is:

1. An inverted organic electronic device comprising:
a first electrode formed on a substrate;
a composite layer on the first electrode,
wherein the composite layer comprises a mixture of a cathode interface material and a photoactive material,
wherein a surface energy of the photoactive material is lower than a surface energy of the cathode interface material,
wherein the cathode interface material comprises at least one selected from the group consisting of polyethyleneimine (PEI), polyallylamine (PAA) and polylysine (PLS), wherein the photoactive material comprises an electron acceptor and an electron donor, and has a bulk heterojunction (BHJ) structure, and wherein the cathode interface material and the photo active material having low surface energy spontaneously form a bilayer through vertical phase separation while lowering work function of the first electrode by generating surface dipoles on a surface of the first electrode;

an anode interface layer formed on the composite layer; and a second electrode formed on the anode interface layer.

2. The inverted organic electronic device according to claim 1, wherein the substrate comprises one material selected from the group consisting of polyethylene terephthalate (PET), polyethylene naphthalate (PEN), polyimide (PI), Si, $SiO_2$, Ge, GaN, AlN, GaP, InP, GaAs, SiC, $Al_2O_3$, $LiAlO_3$, MgO, glass, quartz, sapphire, graphite, graphene, and combinations thereof.

3. The inverted organic electronic device according to claim 1, wherein the first electrode comprises at least one material selected from the group consisting of a metal; a metal alloy; a metal oxide; and a conductive polymer.

4. The inverted organic electronic device according to claim 1, wherein a material for the anode interface layer is selected from the group consisting of poly(3,4-ethylenedioxythiophene):poly(styrenesulfonate) (PEDOT:PSS), bi-phenyl-tri-thiophene (BP3T), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), molybdenum oxide, vanadium oxide, and combinations thereof.

5. The inverted organic electronic device according to claim 1, wherein the second electrode comprises one material selected from the group consisting of a metal; a metal alloy; and a multilayer-structure material including Li and Al.

6. The inverted organic electronic device according to claim 1, further comprising:

at least one additional composite layer between the anode interface layer and the second electrode; and at least one additional anode interface layer formed on the additional composite layer.

7. A method for manufacturing an inverted organic electronic device, comprising:

preparing a substrate having a first electrode;

depositing a mixture of a cathode interface material and a photo active material onto the first electrode to form a composite layer, followed by forming an anode interface layer on the composite layer, wherein the cathode interface material and the photo active material form a bilayer spontaneously through vertical phase separation while lowering a work function of the first electrode by generating surface dipoles on a surface of the first electrode; and forming a second electrode on the anode interface layer, wherein the cathode interface material comprises at least one of polyethyleneimine (PEI), polyallylamine (PAA) and polylysine (PLS), and wherein the photo active material comprises an electron acceptor and an electron donor, and has a bulk heterojunction (BHJ) structure.

8. The method for manufacturing an inverted organic electronic device according to claim 7, wherein the cathode interface material has a higher surface energy than the photo active material.

9. The method for manufacturing an inverted organic electronic device according to claim 7, wherein the mixture of the cathode interface material and the photo active material is prepared by mixing a first solution prepared by dissolving the cathode interface material in a first solvent with a second solution prepared by dissolving the photo active material in a second solvent.

10. The method for manufacturing an inverted organic electronic device according to claim 9, wherein each of the first solvent and the second solvent is selected from the group consisting of water, an organic solvent, and a combination thereof.

11. The method for manufacturing an inverted organic electronic device according to claim 7, wherein the mixture of the cathode interface material and the photo active material is deposited onto the first electrode by spin coating, roll coating, spray coating, flow coating, ink-jet printing, nozzle printing, dip coating, tape casting, screen printing, pad printing, doctor-blade coating, gravure printing, thermal transfer, or gravure offset printing.

12. The method for manufacturing an inverted organic electronic device according to claim 7, further comprising:

after the formation of the anode interface layer and before the formation of the second electrode on the anode interface layer, performing, at least once, a process of forming an additional composite layer, followed by forming an additional anode interface layer on the additional composite layer.

* * * * *